United States Patent [19]

Nuyen

[11] Patent Number: 5,479,043
[45] Date of Patent: Dec. 26, 1995

[54] MULTISPECTRAL PHOTOVOLTAIC COMPONENT

[75] Inventor: Linh T. Nuyen, Paris, France

[73] Assignee: Picogiga Societe Anonyme, Les Ulis, France

[21] Appl. No.: 162,173

[22] PCT Filed: Apr. 15, 1993

[86] PCT No.: PCT/FR93/00374
§ 371 Date: Feb. 14, 1994
§ 102(e) Date: Feb. 14, 1994

[87] PCT Pub. No.: WO93/21661
PCT Pub. Date: Oct. 28, 1993

[30] Foreign Application Priority Data

Apr. 15, 1992 [FR] France ................................ 92 04634

[51] Int. Cl.⁶ .................................................. H01L 31/04
[52] U.S. Cl. .......................... 257/459; 257/440; 257/656
[58] Field of Search ................................ 257/53, 55, 56, 257/656, 448, 459, 440, 458; 136/252, 258

[56] References Cited

U.S. PATENT DOCUMENTS 4,846,931  7/1989  Gmitter et al. ........................ 257/53

FOREIGN PATENT DOCUMENTS 0383391   8/1990   European Pat. Off. .
58-180069 10/1983  Japan ............................ 257/53
60-101979  6/1985  Japan ............................ 257/53

OTHER PUBLICATIONS

Charles Kittel, "Introduction to Solid State Physics" 1971 pp. 100–104.
Y. Matsumoto, "A New Type of High Efficiency With a Low–Cost Solar Cell Having the Structure of a uc–SiC/Polycrystalline . . . ", J. Applied Physics, vol. 67, No. 10, May 15, 1990, pp. 6538–6543.
Y. Kishi et al., "Ultralight Flexible Amorphous Silicon Solar Cell & Its Application for an Airplane", 5th In'l Photovoltaic Science & Eng. Conf., Nov. 26, 1990, pp. 645–648.
B. J. Stanbery et al., "Lightweight Tandem GaAs/CuInSe2 Solar Cells", IEEE Transactions on Electron Devices, vol. 37, No. 2, Feb. 1990, pp. 438–442.
E. Yablonovitch et al., "Van Der Waals Bonding of GaAs Epitaxial Liftoff Films onto Arbitrary Substrates", Applied Physics Letters, vol. 56, No. 24, Jun. 11, 1990, pp. 2419–2421.
E. Yablonovitch et al., "Van Der Waals Bonding of GaAs on Pd Leads to a Permanent, Solid–Phase–Topotaxial, Metallurgical Bond", Applied Physics Letters, vol. 59, No. 24, Dec. 9, 1991, pp. 3159–3161.

Primary Examiner—Donald L. Monin, Jr.
Attorney, Agent, or Firm—Jacobson, Price, Holman & Stern

[57] ABSTRACT

Component comprising a stack of at least two associated elementary cells (1, 2) with different spectral response features, characterized in that at least one of the elementary cells is capable of being mechanically deformed. The flexibility of this cell is sufficiently high that it can adhere directly to the other cell simply by van der Waals' interaction between the two surfaces opposite the elementary cells. The interface (20) separating the two opposite surfaces can be either sufficiently thin to form a tunnel junction electrically coupling both elementary cells to one another, the opposite layers of the elementary cells then being layers of degenerated semiconductor material $p^+$ and $n^+$, sufficiently high to prevent any coupling between the two elementary cells, said cells then each having its own pairs of electrodes leading to separate terminals of the component.

5 Claims, 3 Drawing Sheets

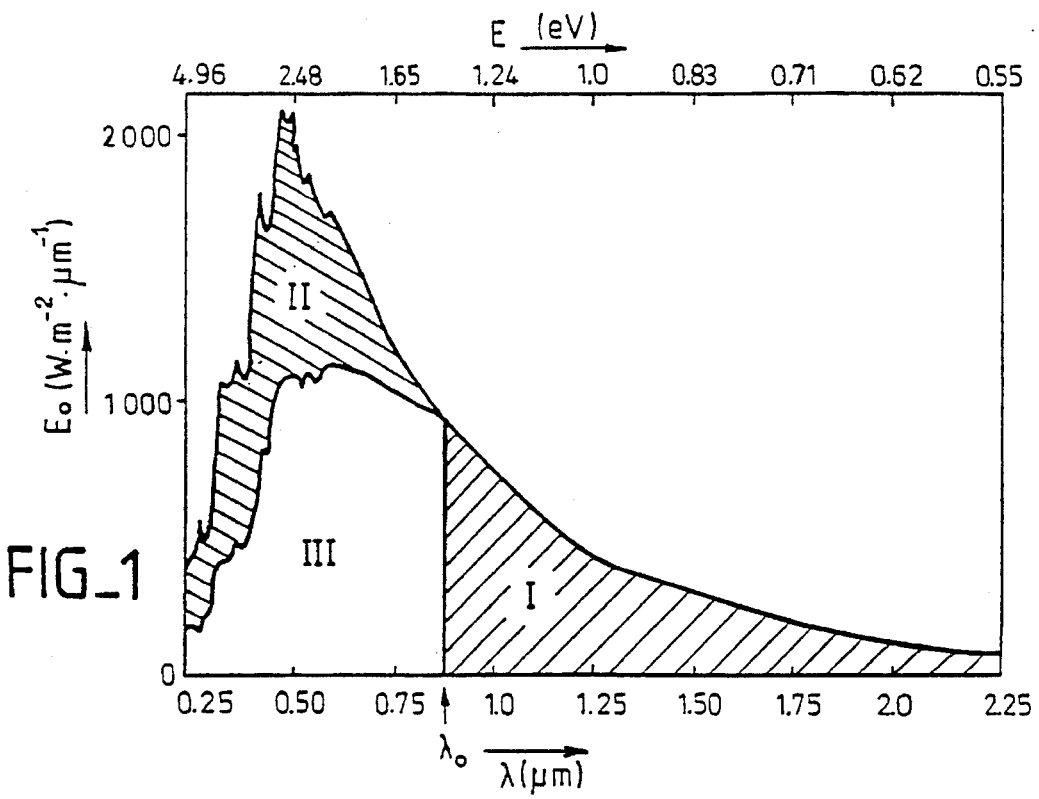
FIG_1
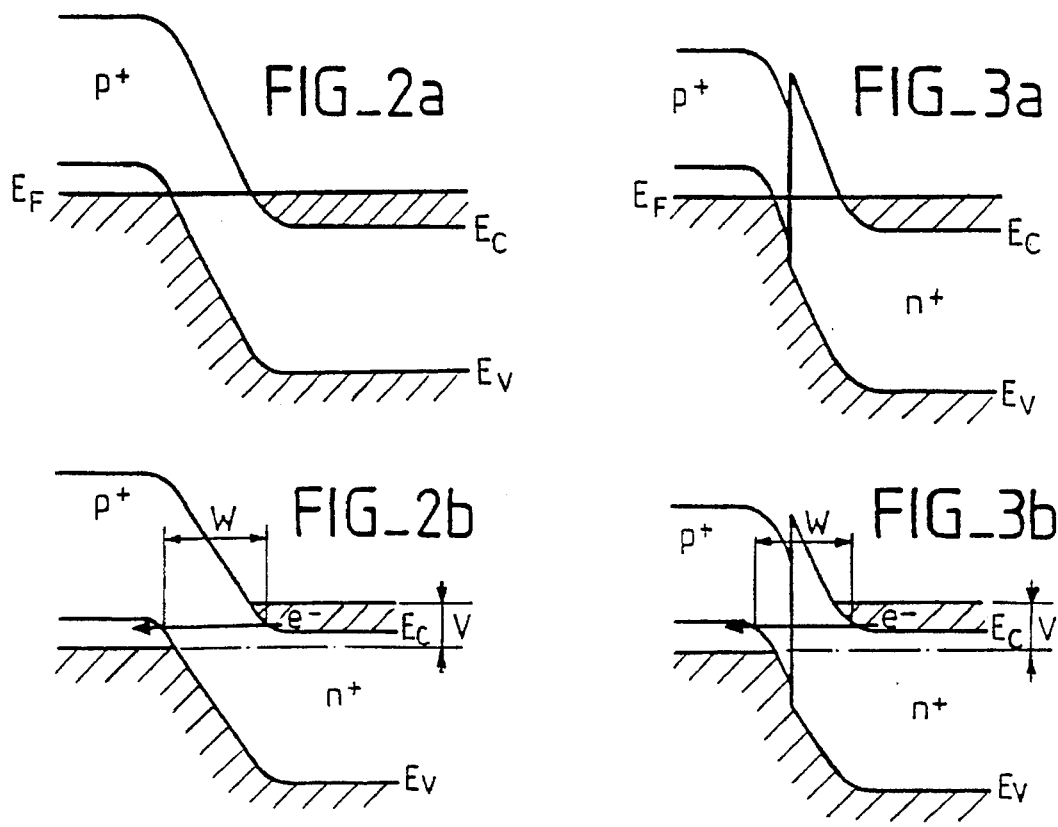

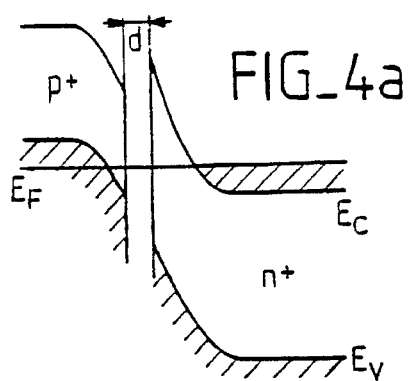
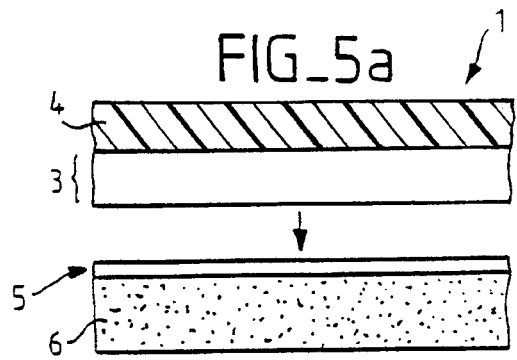
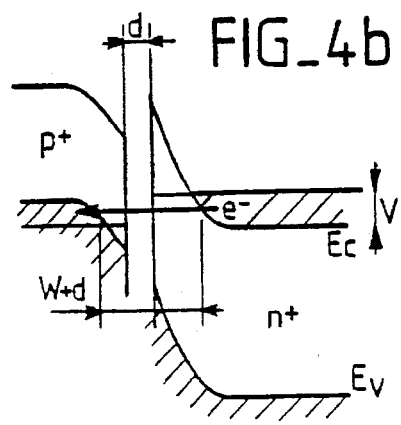
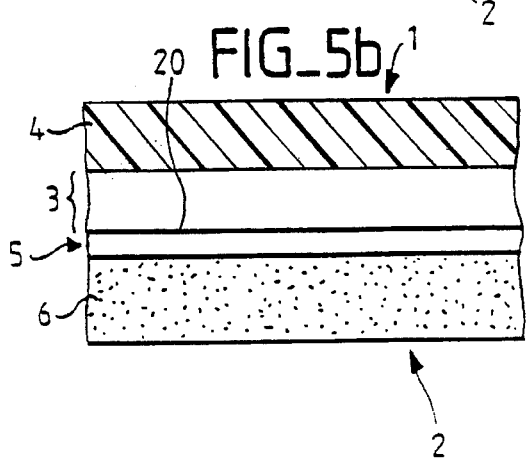
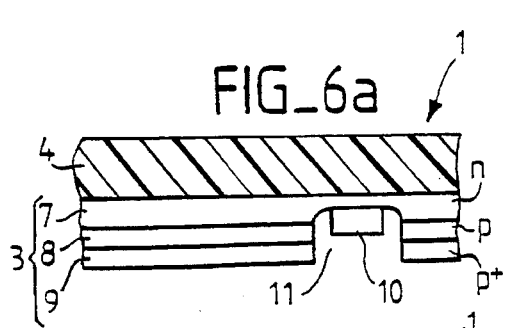
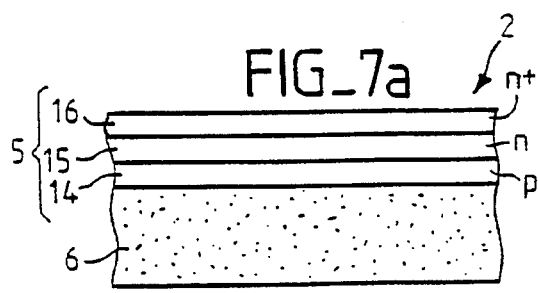
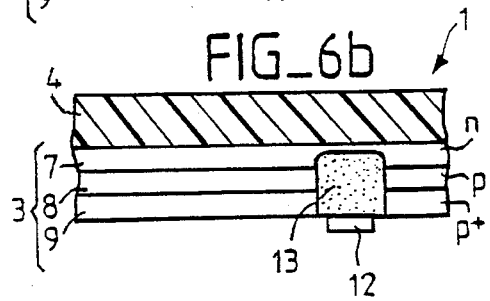
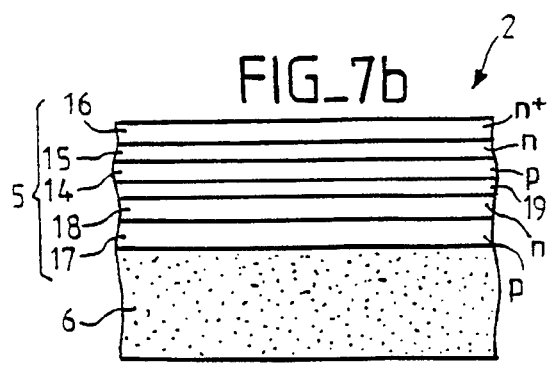

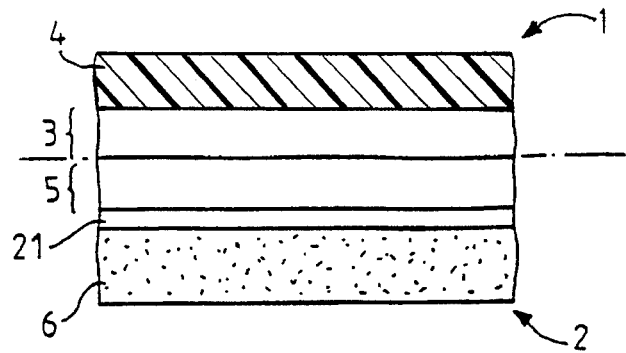
FIG_8a
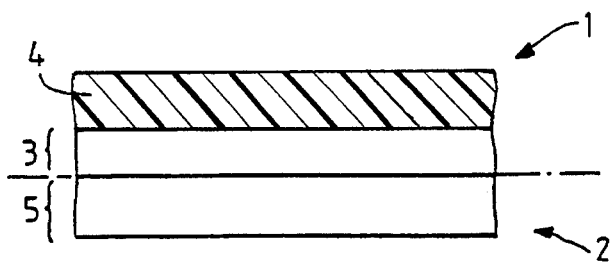
FIG_8b
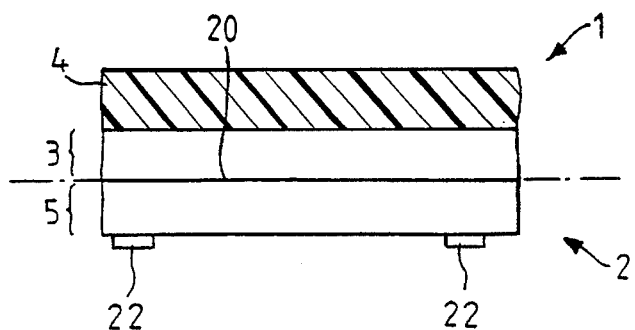
FIG_8c
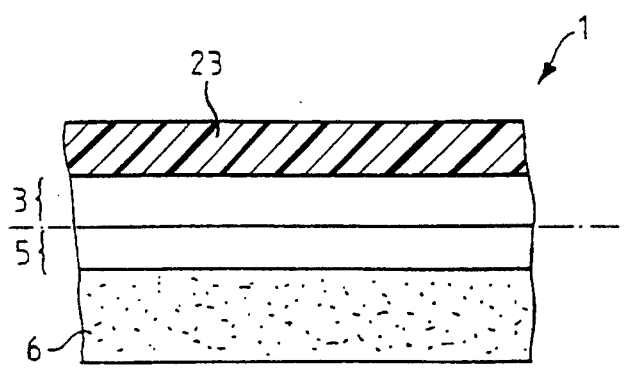
FIG_9a
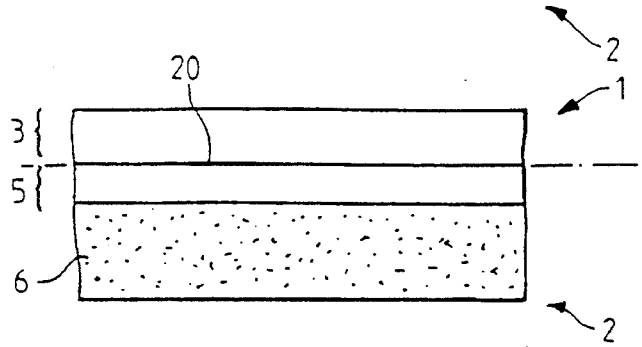
FIG_9b

MULTISPECTRAL PHOTOVOLTAIC COMPONENT

The invention relates, in general, to converting light energy, in particular solar energy, into electrical energy by the photovoltaic effect produced in semiconductors.

Components implementing this effect and generally called "solar cells" normally make use of one species of semiconductor material only, generally silicon or gallium arsenide GaAs.

Nevertheless, it is known that under such circumstances, the complete transformation into electrical energy of the light energy contained in solar radiation cannot be obtained because of the spread in the solar spectrum. Any given semiconductor material has a forbidden band of determined width such that photons of energy below said band width are never absorbed and therefore cannot generate the electron-hole pairs necessary for producing photocurrent. FIG. 1 shows the spectral characteristic of sunlight (ignoring atmospheric absorption), as a plot of radiant flux density as a function of the wavelength or (and this is equivalent) as a function of photon energy. When gallium arsenide is used as the material, the width of the forbidden band is 1.43 eV, corresponding to a wavelength $\lambda_0$ of 867 nm. Photons of energy below 1.43 eV (i.e. of wavelength greater than 8.67 nm) produce no photovoltaic effect, such that the light energy corresponding to the area referenced I is never transformed in any way into electrical energy. In the case of GaAs, this loss of light energy by "transparency" represents 40% of the total available energy in the case of GaAs.

Photons of energy greater than the width of the forbidden band (i.e. of wavelength less than $\lambda_0$) will give rise to electron-hole pairs, but with excess energy relative to the energy of the forbidden band, which excess is converted into heat and not into electrical energy. Such losses by excess energy, corresponding to area II in FIG. 1, may be as much as 20% of the total energy. The use of only one species of semiconductor in a solar cell thus makes it impossible to take advantage of the entire solar spectrum; the intrinsic limit on conversion efficiency for GaAs is thus of the order of 40% (area III in FIG. 1), whereas if it is illuminated with monochromatic light at an energy of (1.43+0.1) eV, the intrinsic efficiency of the material is close to 95%.

To improve the conversion of solar energy, several solutions have been proposed, in which a plurality of different semiconductors having different forbidden band-widths are associated. Such components are referred to as "multispectral solar cells" and they can be subdivided into three families corresponding to three different basic configurations.

In a so-called "dichroic" first configuration, an optical separator system having dichroic mirrors splits the incident solar spectrum into a plurality of portions corresponding to sub-bands of the spectrum. Each of these portions is applied to a solar cell of a different type, optimized for a given photon energy.

That configuration is effective, but it requires a complex optical system to be implemented that is bulky, fragile, and expensive.

A so-called "monolithic" second configuration consists in providing a stack of solar cells made up of successive layers grown epitaxially on a common substrate, the various cells being electrically coupled together in series by tunnel junctions. The first cell captures the most energetic photons of the incident flux, while passing the others that are absorbed by the next cell down, and so on.

Because of its monolithic character, said second configuration is extremely compact and robust, but it nevertheless suffers from several drawbacks.

A first drawback stems from the fact that it is not possible to associate silicon cells whose advantages and ease of manufacture are well known with GaAs cells since it is not known at present how to make a tunnel junction between silicon and gallium arsenide.

A second drawback stems from the fact that although it is known how to make tunnel junctions between III–V semiconductors by epitaxy, providing said materials have crystal lattice constants that are compatible (i.e. identical or very similar), in practice only two series of materials can be selected, one having lattice constants applicable to GaAs and the other applicable to InP.

Unfortunately, the materials that can be grown epitaxially on GaAs, such as AlGaAs, have forbidden bands of width greater than those of GaAs, such that the "transparency" losses of about 40% of the total energy are not reduced compared with a cell made of GaAs alone. Conversely, the materials that can be grown epitaxially on InP are limited to forbidden bands that are narrow, thereby giving rise to major losses by excess energy.

In addition, at present there is no known way of making a tunnel junction between GaAs and InP because of the large difference in the crystal lattice constants of those two materials. It is thus not possible with epitaxially grown monolithic cells to optimize conversion efficiency by associating these two families of materials to obtain conversion over a broad energy spectrum.

A third drawback of the monolithic configuration relates to the fact that the various cells are coupled together in series and therefore together they produce a photocurrent that is necessarily limited to the smallest photocurrent generated by any one of the cells. Even if the photocurrents of the various cells are adjusted so as to be close to one another, they vary greatly and they vary differently as a function of atmospheric conditions, the direction of the incident radiation, etc.

In a so-called "stacked" third configuration proposed for a multispectral cell, two or more different cells are initially prepared each on its own substrate, and the cells are then superposed by being fixed together by transparent adhesive. The adhesive may either be conductive, thereby enabling two cells to be connected together in series (but in that case the photocurrent produced by the device is limited to the lowest generated photocurrent, as in the monolithic configuration), or else it may be insulating, in which case the cells are provided with their own electrodes that are separately connected to distinct circuits in the electronics of the charging system (which needs to be designed accordingly).

That configuration also suffers from certain drawbacks, in particular due to the fact that the final component must have two thicknesses of substrate (since two cells need to be made separately), thereby adding weight and cost to the structure, particularly in a structure comprising a stack comprising a GaAs cell (or even worse an InP cell) on a silicon cell: the heavier and more expensive GaAs substrate serves not as a mechanical support and plays no active role.

The object of the invention is to remedy the respective drawbacks of those various known configurations by proposing a novel configuration that is intermediate between the known monolithic configuration and the known stacked configuration, and which combines the respective advantages of those structures without suffering from their drawbacks.

Compared with known monolithic configurations, it will be seen, in particular, that in a first implementation the invention proposes making solar cells that present a stack of semiconductor layers having different lattice constants, with this being done by a novel method of making a tunnel junction, thus making it possible to enlarge the energy spectrum of absorbed photons and to considerably improve conversion efficiency while maintaining the advantages of compactness and simplicity specific to the monolithic configuration.

Compared with known stack configurations, it will be seen that in a second implementation, the invention proposes simplifying the manufacture of a stacked cell by avoiding the need for adhesive, and also by reducing cost and weight by eliminating and recovering that one of the substrates that does not play an active role and that does not act as a mechanical support, particularly a substrate of GaAs or of InP.

To this end, the multispectral cell of the invention which comprises a stack of at least two elementary cells in association and having different spectral response characteristics is characterized in that at least one of the elementary cells is mechanically deformable, its flexibility being selected to be high enough to enable it to adhere directly to the other cell merely by van der Waals interaction between the two facing surfaces of the elementary cells.

In the above-mentioned first implementation, the thickness of the interface between the two facing surfaces is thin enough to form a tunnel junction that electrically interconnects the two elementary cells, and the facing layers of the elementary cells are then respectively $p^+$ and $n^+$ layers of degenerate semiconductor material.

In the second above-mentioned implementation, the thickness of the interface is, on the contrary, sufficiently great to prevent any coupling between the two elementary cells, and the cells are then each provided with their own pairs of electrodes that terminate at respective distinct terminals of the component.

Advantageously, at least one of the elementary cells includes a layer of amorphous silicon deposited on a flexible plastic film. In a variant, or in addition, at least one of the elementary cells may also include a thin layer of semiconductor material detached from the substrate on which it was formed.

Implementations of the invention are described below with reference to the accompanying drawings, in which the same numerical references are used throughout to designate elements that are similar.

Above-mentioned FIG. 1 shows the spectral characteristic of sunlight, ignoring atmospheric absorption.

FIGS. 2a and 2b are band diagrams (valance band and conduction band) for a conventional tunnel homojunction respectively at rest and under forward bias.

FIGS. 3a and 3b are similar to FIGS. 2a and 2b but for a conventional tunnel heterojunction between two epitaxially-grown layers.

FIGS. 4a and 4b are similar to FIGS. 2a and 2b, but for a tunnel heterojunction between two layers that are merely stuck together without taking special precautions.

FIGS. 5a and 5b are diagrams showing the configuration of the invention for associating two cells of different types, shown disjoint in FIG. 5a and stuck together in FIG. 5b.

FIGS. 6a and 6b show in greater detail the structure of the upper cell of amorphous silicon in the configuration of the invention shown in FIG. 5, respectively for two different methods of making contact.

FIGS. 7a and 7b show two variants of the lower cell on a III–V semiconductor in the stack of FIG. 5.

FIGS. 8a to 8c show successive steps in a variant implementation for separating the substrate and recovering it by chemical dissolution.

FIGS. 9a and 9b show a variant implementation of the method shown in FIGS. 8a to 8c.

FIGS. 2a and 2b are band diagrams of a conventional tunnel junction respectively at rest and under forward bias, the junction being constituted by a $p^+/n^+$ homojunction between two degenerate semiconductors (i.e. which are very heavily doped so as to place the Fermi level $E_F$ above the conduction band $E_c$ in the $n^+$ semiconductor, and below the valance band $E_v$ in the $p^+$ semiconductor. Under forward bias, the tunnel effect causes electrons to be transferred (see FIG. 2b) from the $n^+$ degenerate semiconductor to free states in the valance band of the $p^+$ degenerate semiconductor.

It is known that the tunnel current is an exponential function of the width W of the space charge zone, with current falling off very rapidly as said width increases.

The tunnel junction may also be obtained with heterojunctions, i.e. junctions between $p^+$ and $n^+$ materials having forbidden bands of different widths. FIGS. 3a and 3b are similar to FIGS. 2a and 2b and they correspond to this configuration for an ideal $p^+/n^+$ heterojunction, i.e. one in which the $p^+$ and $n^+$ materials have the same crystal lattice constant and are in perfect epitaxial connection one with the other.

In practice, when the two materials do not have the same lattice constant, their epitaxial growth creates a large density of dislocations at their interface, causing numerous crystal and electrical faults to be created (deep traps) which completely deform the band diagram and considerably disturb the tunnel effect. The junction then has high electrical resistance which irremediably degrades the performance of the component.

In addition, in practice, a $p^+/n^+$ junction is never completely sharp because of cross-diffusion of the p and n dopants which reduce the doping of the materials in the vicinity of the interface; this cross-diffusion extends over a zone that may be several tenths of a nanometer to several nanometers wide, thereby further increasing the thickness of the space charge region and correspondingly reducing the tunnel effect.

Instead of growing two $p^+/n^+$ materials having different lattice constants epitaxially, the key idea of the invention consists in merely sticking these two materials together.

Nevertheless, this idea comes up against the practical difficulty that stems from the fact that the surfaces of semiconductors are generally slightly oxidized or contain adsorbed species. If this layer of oxide or of adsorbent is very thin, of the order of a few tenths of a nanometer to a few nanometers at most, then electrons can pass through it by the tunnel effect. However, when it comes to behavior, such a tunnel heterojunction presents electrical resistance that is higher than a conventional tunnel junction between two materials grown epitaxially, since the width W of the space zone proper is increased by the thickness d between the facing $p^+$ and $n^+$ active surfaces. FIGS. 4a and 4b which are similar to FIGS. 3a and 3b comprise band diagrams of a heterojunction operating by the tunnel effect in accordance with this principle.

Unfortunately, in the present state of the art in semiconductor technology, the planeness of the surfaces produced can be guaranteed only to within 1 µm, so if it is desired that a tunnel effect shall be capable of appearing, merely sticking two wafers of semiconductor material together will not suffice.

Under such circumstances, implementing the invention thus requires a solution to the problem which consists in coupling together the two semiconductor materials while ensuring that the distance between them does not exceed a few tenths of a nanometer to a few nanometers.

To do this, the invention proposes that one of the semiconductor materials should be selected from a material that is mechanically deformable with great flexibility enabling it to take up the shape and surface roughness of the other semiconductor, thereby ensuring very intimate contact between the two surfaces. The two surfaces will then adhere to each other merely by a van de Waals type interaction because of their very smooth nature, without requiring any adhesive or other mechanical or fixing means.

In a variant, instead of electrically coupling the two cells together by the tunnel effect, it may be preferred to isolate them completely from the electrical point of view (which can be achieved merely by providing a layer of oxide between the two cells that is of sufficient thickness). Electrodes should then be provided on either side of each of the cells with said electrodes leading to distinct terminals of the cell in a manner comparable to known stacked configurations, but with the important difference that no transparent adhesive is required for ensuring adhesion between two cells, since the adhesion is provided purely and simply by van der Waals interaction.

Nevertheless, in either case, implementing the invention requires a solution to another problem, namely obtaining a cell that is sufficiently deformable mechanically to enable it to be stuck to another cell by van der Walls interaction.

To do this, the present invention proposes, in non-limiting manner, several methods of implementation.

A first method consists in using cells of amorphous silicon initially deposited on a flexible plastics film, for example such as the cells described by A. Takeoka, *Technology Brightens Prospects for Solar Power*, Journal of Electronic Engineering, July 1991, p. 100.

FIGS. 5a and 5b are diagrams respectively before and after adhesion showing a multispectral cell implemented in accordance with the teaching of the invention, in which an amorphous silicon cell (comprising an active layer 3 deposited on a flexible film 4) is associated with a gallium arsenide cell comprising an active layer 5 deposited on a substrate 6.

The amorphous silicon cell 1 of structure that is known per se is shown in greater detail in FIGS. 6a and 6b.

The active layer given overall reference 3 is deposited on the flexible plastics film 4 and comprises in succession: a layer 7 of n amorphous silicon, a layer of p amorphous silicon, and a layer 9 of $p^+$ amorphous silicon if it is desired to implement tunnel junction coupling between the cells. Electrical contact with n layer 7 is provided by an electrode 10 deposited at the bottom of the well 11 etched through the thickness of the active layer (FIG. 6a) or by means of an electrode 12 deposited on the surface of an n island 13 (FIG. 6b). In the following figures, this overall structure is not shown in detail, it is merely designated by reference 3 which constitutes a general reference to the active layer.

In a variant, instead of using a flexible plastic for the support 4, it will be possible to use a cell in which the amorphous silicon 1 is deposited on a rigid plastic which is then made flexible by appropriate thermal or chemical treatment that is known per se.

The gallium arsenide cell 2 associated with the amorphous silicon cell may be of a very wide variety of shapes and of chosen materials. For example, it may have the structure as shown in FIGS. 7a or 7b. FIG. 7a shows a solar cell on GaAs comprising, on a substrate 6, an active layer 5 with the following layers in succession: a layer 14 of p GaAs, a layer 15 of n GaAs, and a layer 16 of $n^+$ GaAs if it is desired to couple the two cells together by the tunnel effect (this layer 16 is designed to constitute the tunnel junction in association with the $p^+$ doped layer 9 of the cell 1; conversely, it would be equally possible to have an $n^+$ doped layer 9 and a $p^+$ doped layer 16). In the example of FIG. 7, the active layer 5 itself includes a heterojunction and comprises, on the substrate 6, a layer 17 of p AlGaAs, a layer 18 of n AlGaAs, the layer 14 of p GaAs, the layer 15 of n GaAs, and the layer 16 of $n^+$ GaAs, an additional tunnel junction thus being constituted at 19 between the GaAs and the AlGaAs layers. By associating this cell with the silicon cell 1, a multispectral cell is obtained having three elementary cells, thereby making it possible further to improve conversion efficiency.

Naturally, the choice of cell 2 is not limited to these two examples, and it could be made of other materials providing the width of the forbidden of the material is greater than that of silicon and is compatible with multispectral operation.

In addition, as mentioned above, the two cells 1 and 2 are not necessarily coupled together by a tunnel junction at their interface (20 in FIG. 5), but they may merely be stuck one to another without direct electrical coupling, distinct contact-making electrodes then being used for picking up the photocurrents to feed different electronic circuits in the charging system. Under such circumstances, it suffices to provide an oxide layer on the surface of the cell 1 and/or of the cell 2 that is sufficiently thick to prevent any tunnel effect appearing at the interface 20 (thicker than a few tens of nanometers); in addition, the layers 9 and 16 of the degenerate semiconductor are no longer necessary under such circumstances.

In a variant implementation, applicable to either of the cases described above (with or without tunnel junction coupling), the substrate of the cell 2 is eliminated, as shown in FIGS. 8a to 8c. Not only does this substrate perform no mechanical function (since the film 4 is strong enough to support the entire cell), but in addition it is both heavy and expensive (GaAs, and a fortiori, InP); it is therefore particularly advantageous to remove it and to recover it.

To this end, it is possible to provide an additional separator layer 21 between the GaAs substrate 6 and the GaAs active layer 5 of the cell 2, the layer 21 being soluble, e.g. a layer of AlGaAs whose aluminum content (molar fraction) is at least 0.4.

The two cells are then stuck together as in the preceding case (FIG. 8a). Thereafter, the separator layer 21 is dissolved chemically or electrochemically, thereby enabling the substrate to be detached and recovered, thus enabling it to be reused. These dissolving techniques are described, for example, by M. Konagai et al. in *High Efficiency GaAs Thin Film Solar Cells by Peeled Film Technology*, Journal of Crystal Growth, No. 45 (1978), p. 277, and also in French patent applications 91-15139 and 91-15141 in the name of the Applicant. This gives rise to the structure of FIG. 8b. Electrodes 22 can then be deposited on its surface, thereby making contact directly with the back of the active layer 5; the structure finally obtained is shown in FIG. 8c.

Another variant, shown in FIGS. 9a and 9b consists in detaching the substrate of the cell 1 instead of detaching the substrate of the cell 2 (substrate 23 in FIG. 9a, removed in FIG. 9b). The substrate could be removed in particular using one of the techniques described in above-specified French patent applications 91-15139 and 91-15141. Under such circumstances, it is the substrate 6 of the cell 2 that acts as the mechanical support of the final cell.

I claim:

1. A multispectral photovoltaic component comprising a stack of at least two adjacent elementary cells having facing surfaces and different spectral response characteristics, the component being characterized in that at least one of the elementary cells adheres to an adjacent elementary cell solely through van der Waals interaction between the facing surfaces, effected by sufficient flexibility of the at least one of the elementary cells.

2. The component of claim 1 in which an interface between the facing surfaces is thin enough to form a tunnel junction electrically coupling the at least two adjacent elementary cells together, in a facing layer on each of the elementary cells is a $p^+$ and $n^+$ layer of degenerate semiconductor material.

3. The component of claim 1 in which an interface between the facing surfaces is large enough to prevent coupling between the at least adjacent elementary cells, each of the cells having a pair of electrodes terminating at distinct respective terminals of the component.

4. The component of claim 1 in which the at least one of the elementary cells having sufficient flexibility comprises a layer of amorphous silicone deposited on a flexible plastic film.

5. The component of claim 1 in which the at least one of the elementary cells having sufficient flexibility comprises a thin layer of substrate-formed semiconductor material, without the substrate.

* * * * *